United States Patent [19]

Yanagida

[11] Patent Number: 5,717,556
[45] Date of Patent: Feb. 10, 1998

[54] PRINTED-WIRING BOARD HAVING PLURAL PARALLEL-CONNECTED INTERCONNECTIONS

[75] Inventor: Keiichirou Yanagida, Tokyo, Japan

[73] Assignee: NEC Corporation, Tokyo, Japan

[21] Appl. No.: 638,939

[22] Filed: Apr. 25, 1996

[30] Foreign Application Priority Data

Apr. 26, 1995 [JP] Japan ..................... 7-125780

[51] Int. Cl.$^6$ .................. H05K 1/11; H01R 9/09
[52] U.S. Cl. ............. 361/803; 174/254; 361/749; 361/784; 439/67; 439/77
[58] Field of Search .................. 174/117 F, 117 FF, 174/254, 255, 261, 268; 156/250; 257/700, 723, 724; 361/748, 785, 749, 784, 792–795, 803, 804; 439/67, 77

[56] References Cited

U.S. PATENT DOCUMENTS

| | | | |
|---|---|---|---|
| 4,495,546 | 1/1985 | Nakamura et al. | 361/749 |
| 4,602,319 | 7/1986 | Feick | 361/789 |
| 4,742,183 | 5/1988 | Soloway | 174/254 |
| 5,008,496 | 4/1991 | Schmidt et al. | 174/254 |
| 5,045,970 | 9/1991 | Raschke | 361/777 |
| 5,047,895 | 9/1991 | Sasaki | 361/749 |
| 5,100,492 | 3/1992 | Kober et al. | 361/749 |
| 5,122,215 | 6/1992 | Shibata et al. | 156/250 |
| 5,220,488 | 6/1993 | Denes | 361/749 |
| 5,224,023 | 6/1993 | Smith et al. | 361/749 |
| 5,263,248 | 11/1993 | Kiyota et al. | 361/749 |
| 5,434,362 | 7/1995 | Klosowiak et al. | 174/254 |
| 5,499,444 | 3/1996 | Doane, Jr. et al. | 361/749 |

FOREIGN PATENT DOCUMENTS

| | | |
|---|---|---|
| 0065425A2 | 11/1982 | European Pat. Off. . |
| 63-135174 | 9/1988 | Japan . |
| 2218194 | 8/1990 | Japan . |
| 414889 | 1/1992 | Japan . |
| 4249224 | 9/1992 | Japan . |
| 582917 | 4/1993 | Japan . |
| 5-129747 | 5/1993 | Japan ..................... 439/77 |
| 5-275814 | 10/1993 | Japan ..................... 439/77 |
| 2061623 | 5/1981 | United Kingdom ......... 361/785 |
| 2130019A | 5/1984 | United Kingdom . |

Primary Examiner—Donald Sparks
Attorney, Agent, or Firm—Whitham, Curtis, Whitham & McGinn

[57] ABSTRACT

In a printed-wiring board, first and second hard substrates each having electronic components mounted thereon are connected through a flexible substrate interposed therebetween. A circuit pattern printed on each of the hard and flexible substrates electrically connects the electronic components mounted on the hard substrates through the flexible substrate. The circuit pattern includes a plurality of parallel-connected signal lines. The parallel-connected signal lines are spatially separated on the flexible substrate, and the both ends of the parallel-connected signal lines are located in the hard substrates, respectively. A single signal line of the circuit pattern branches on one hard substrate into the parallel-connected signal lines, which extend through the flexible substrate and are converged to a single signal line on the other hard substrate.

32 Claims, 6 Drawing Sheets

PRINTED-WIRING BOARD HAVING PLURAL PARALLEL-CONNECTED INTERCONNECTIONS

BACKGROUND OF THE INVENTION

1. Field of the Invention

The present invention relates to a printed-wiring board consisting of a plurality of hard wiring substrates and a flexible substrate interposed between the hard substrates, and more particularly to such a printed-wiring board which suppresses an occurrence of equipment or device failure that is caused by the breaking of circuit patterns printed on the flexible substrate.

2. Description of the Related Art

In general, communication terminal equipment or other electric-electronic instruments widely use a printed-wiring board including a freely flexibly deformable substrate, such as a polyimide substrate, on which circuit patterns are printed.

This kind of printed-wiring board having a flexible substrate is used when a hard printed-wiring board is mounted in a curved or bent space or is folded and mounted in a narrow space, or when a hard printed-wiring board is used for wiring, for example, a movable portion of a printer head. The flexible substrate is connected to part of the hard printed-wiring board, and the entire board is bent or folded so that it can be mounted in a wide variety of instruments.

As an example, in FIG. 1, there is shown a conventional printed-wiring board. The conventional printed-wiring board includes a flexible substrate 1 formed from a flexible material such as a polyimide material and also includes two hard boards 2 and 3 connected together by the flexible substrate 1. On the surface of the flexible substrate 1 and the surfaces of the hard substrates 2 and 3, circuit patterns 4 are formed by printing, etc. The circuit patterns 4 are connected to electronic components 5, 6, 7, 8, and 9 mounted on the hard substrates 2 and 3, and the electronic components are electrically connected by the circuit patterns 4.

Such a printed-wiring board provided with a flexible substrate can be freely curved or bent, because the flexible Substrate 1 itself is constituted by a freely deformable material. For example, the two hard substrates 2 and 3 can be bent at right angles, or can be superimposed and folded. Also, either or both of the hard substrates 2 and 3 can be freely moved as a movable portion.

Thus, the printed-wiring board with a flexible substrate can be curved or bent so that it can be moved and mounted in equipment or devices, so the printed-wiring board has the advantage that the space in electronic equipment can be saved and also the degree of freedom in the mounting layout is increased. Furthermore, the printed-wiring board can be used in the movable portion of devices, etc.

But, on the other hand, the printed-wiring board has the following disadvantages, because the flexible substrate itself is very soft. That is, thermal stress, secular change, or repeated bending motion of a movable portion causes the circuit patterns printed on the flexible substrate to break or causes a defect such as floating and separation to occur in connecting the flexible substrate to the hard substrate during a fabricating process. As a consequence, equipment or devices on which the printed-wiring board is mounted are susceptible to a breakdown.

Then, in order to prevent a reduction in the reliability of finished products that is caused by the breaking of the circuit patterns printed on the flexible substrate, a wide variety of propositions have hitherto been made.

For example, in Japanese Laid-Open Patent Publication No. HEI 2-218194 there is proposed a flexible printed-wiring board which has a strong resistance to thermal stress and is less susceptible to breaking of a wire. By providing a reinforcing member composed of a polymer having thermotropic liquid crystal property, the reinforcing member absorbs part of thermal stress generated at the time of thermal shock and circuitry can be protected from thermal stress.

In Japan Laid-Open Patent Publication No. HEI 4-14889 there is proposed a circuit module where pattern disconnection by thermal stress generated at the time of fabrication is prevented by providing a pattern not related to a signal line in a flexible substrate and a pattern not related to a signal line in a circuit substrate of the circuit module opposed to the flexible substrate and soldering the patterns together.

In Japan Laid-Open Patent Publication No. HEI 4-249224 there is proposed a liquid crystal display device where a correction of the breaking of a wire in the liquid crystal display panel is facilitated by providing a plurality of correction electrode pads on the back surface of a flexible substrate having panel drive ICs mounted thereon and wiring and connecting two correction pads correctly opposed with respect to a broken portion of the liquid crystal panel detected.

In Japan Laid-Open Utility Model Publication No. SHO 63-135174 there is proposed a flexible connection conductor with a function of diagnosing the breaking of a wire. In a flexible printed-circuit board or a flexible connection conductor such as a flat cable, a dummy conductor is disposed on the side end and a sensing means for sensing the breaking of the dummy conductor is provided. With this structure, a breakdown of the dummy conductor can be sensed beforehand and also a suitable countermeasure can be taken prior to the breaking of a signal line.

However, the aforementioned flexible printed-wiring board, disclosed in Japan Laid-open Patent Publication No. HEI 2-218194, can cope with the breaking of a wire of a conductor circuit caused by thermal stress generated at the time of thermal shock, but it cannot remove damages, which result from the breaking of a wire in the process of fabricating a printed-wiring board, the breaking of a wire caused by the bending motion of a movable portion, or the breaking of a wire caused by secular change.

In the aforementioned circuit module disclosed in Japan Laid-Open Patent Publication No. BET 4-14889, the breaking of a pattern by the stress generated at the time of assembling can be prevented, but this module cannot cope with the breaking of the conductor circuit by thermal stress after completion of a finished product, the breaking of a wire in a movable portion, or the breaking of a wire caused by secular change.

In the aforementioned liquid crystal display device disclosed in Japan Laid-Open Patent Publication No. HEI 4-249224, the correction after the occurrence of the breaking of a wire in the liquid crystal display panel, that is, a post-correction operation can be easily performed, but an occurrence itself of equipment or device breakdown caused by the breaking of a wire cannot be prevented.

In the aforementioned flexible connection conductor with a breaking diagnosis function disclosed in Japan Laid-Open Utility Model Publication No. SHO 63-135174, the time of the breaking of the conductor can be predicted beforehand, but the occurrence of the breaking of the conductor, or equipment or device failure itself caused by the breaking of the conductor cannot be prevented.

In Japan Laid-Open Patent Publication No. HEI 5-82917 there is proposed a flexible wiring board having an exposed structure. A branch area is provided in the flexible wiring board, and on the end portion, a first terminal array having a plurality of terminals for external connection and a second terminal array are disposed. Independent circuit patterns are provided in these terminal arrays, respectively, and also conductive patterns are exposed to the branch area adjacent to the independent circuit patterns. The conductive patterns are shifted from each other and joined together so that the conductive patterns can be soldered when they are folded so that they are superimposed on the terminal arrays. According, to the flexible wiring board, a multi-layer can be formed from a sheet of flexible wiring board and also the number of fabricating processes can be reduced.

However, the object of the invention disclosed in Japan Laid-Open Patent Publication No. HEI 5-82917 is to provide a flexible multi-layer wiring board, so this publication does not propose a technique for preventing an occurrence of device failure caused by the breaking of a circuit pattern and therefore cannot solve the problems found in the prior art.

SUMMARY OF THE INVENTION

The present invention has been proposed in order to overcome the aforementioned problems inevitably inherent in the prior art.

Accordingly, it is an object of the present invention to provide a printed-wiring board where reliability in a finished product can be enhanced by reducing a rate of occurrence of equipment or device failure resulting from the breaking of a wire caused by, for example, the thermal stress, bending motion, and secular change of circuit patterns printed on the flexible substrate, or from the breaking of a wire during a fabrication process.

It is another object of the present invention to provide a printed-wiring board which can achieve the reduced area required for wiring with enhanced reliability.

To achieve these ends and in accordance with one aspect of the present invention, in a printed wiring board having a first hard substrate and a second hard substrate which are connected by a flexible substrate, a circuit pattern is formed to electrically connect between the first and second hard substrates through the flexible substrate comprises a plurality of parallel-connected conductive lines each being spatially separated from each other in the flexible substrate, and both ends of each of the parallel-connected conductive lines being located on the first and second hard substrates, respectively.

In other words, the first hard substrate has a first conductor formed thereon, and the first conductor branches into a predetermined number of first signal lines at a first branching point. The second hard substrate has a second conductor formed thereon, and the second conductor branches into the predetermined number of second signal lines at a second branching point, which correspond one by one to the first signal lines. The flexible substrate for connecting the first and second hard substrates together has a circuit pattern formed thereon which is comprised of the predetermined number of conductive lines each being spatially separated from each other on the flexible substrate. The conductive lines electrically connects the first signal lines with the second signal lines, respectively.

In accordance with another aspect of the present invention, there is provided a printed wiring board having a first hard substrate having a plurality of first conductors formed thereon and a second hard substrate having the plurality of second conductors formed thereon. The second conductors are to be electrically connected to the first conductors, respectively. The first and second hard substrates are connected through a flexible substrate. In such a basic structure, a plurality of circuit patterns are formed in each of the first and second hard substrates and the flexible substrate, electrically connecting the first conductors with the second conductors through the flexible substrate, respectively. Each of the circuit patterns is comprised of a plurality of parallel-connected conductive lines each being spatially separated from each other in the flexible substrate, and both ends of each of the parallel-connected conductive lines being located on the first and second hard substrates, respectively.

According to still another aspect of the present invention, there is provided a printed-wiring board comprising a plurality of hard substrates each having electronic components mounted thereon, a flexible substrate interposed between two or more of the hard substrates for connecting two or more hard substrates together, and a plurality of circuit patterns printed on each of the hard and flexible substrates, each electrically connecting the electronic components mounted on the hard substrates through the flexible substrate. A single signal line of each of the circuit patterns is branched into a plurality of signal lines on one hard substrate of the hard substrates. The branched signal lines extend through the flexible substrate and are converged to the corresponding single signal line on the other hard substrate.

In a preferred form of the present invention, some of the branched signal lines are formed on a back surface of the one hard substrate through a connecting conductor such as a plated through-hole or a plated via-hole provided in the one hard substrate, extend through a back surface of the flexible substrate, and are connected to a front surface of the other hard substrate through another connection conductor provided in the other hard substrate.

In another preferred form of the present invention, all of the branched circuit patterns are formed on a back surface of the one bard substrate through a connecting conductor provided in the one hard substrate, extend through a back surface of the flexible substrate, and are connected to a front surface of the other hard substrate through another connecting conductor provided in the other hard substrate.

In still another preferred form of the present invention, the circuit pattern comprises a plurality of circuit patterns, one circuit pattern being branched and disposed only a front surface of the flexible substrate, and another circuit pattern being branched and disposed only on a back surface of the flexible substrate through a pair of connecting conductor holes such as a plated through-holes provided in the respective hard substrates.

Thus, in accordance with the printed-wiring board of the present invention, a single signal line is branched on one hard substrate into a plurality of signal lines which are connected the respective signal lines on the flexible substrate connecting the hard substrates, and the signal lines on the flexible substrate are converged on the other hard substrate to another single signal line. In other words, the circuit pattern includes a plurality of parallel-connected signal lines.

Therefore, even if some of the parallel-connected signal lines of the circuit pattern were broken, the operation and performance of equipment or devices on which the printed-wiring board is mounted would be maintained as long as all of the parallel-connected signal lines are not broken. Further, by using different layers to provide the parallel-connected signal lines; an increased number of circuit patterns can be formed in restricted areas on the hard and flexible substrates.

The above and other objects and advantages of the present invention will become apparent from the following detailed description when read in conjunction with the accompanying drawings.

DETAILED DESCRIPTION OF THE PREFERRED EMBODIMENTS

Figure 1:
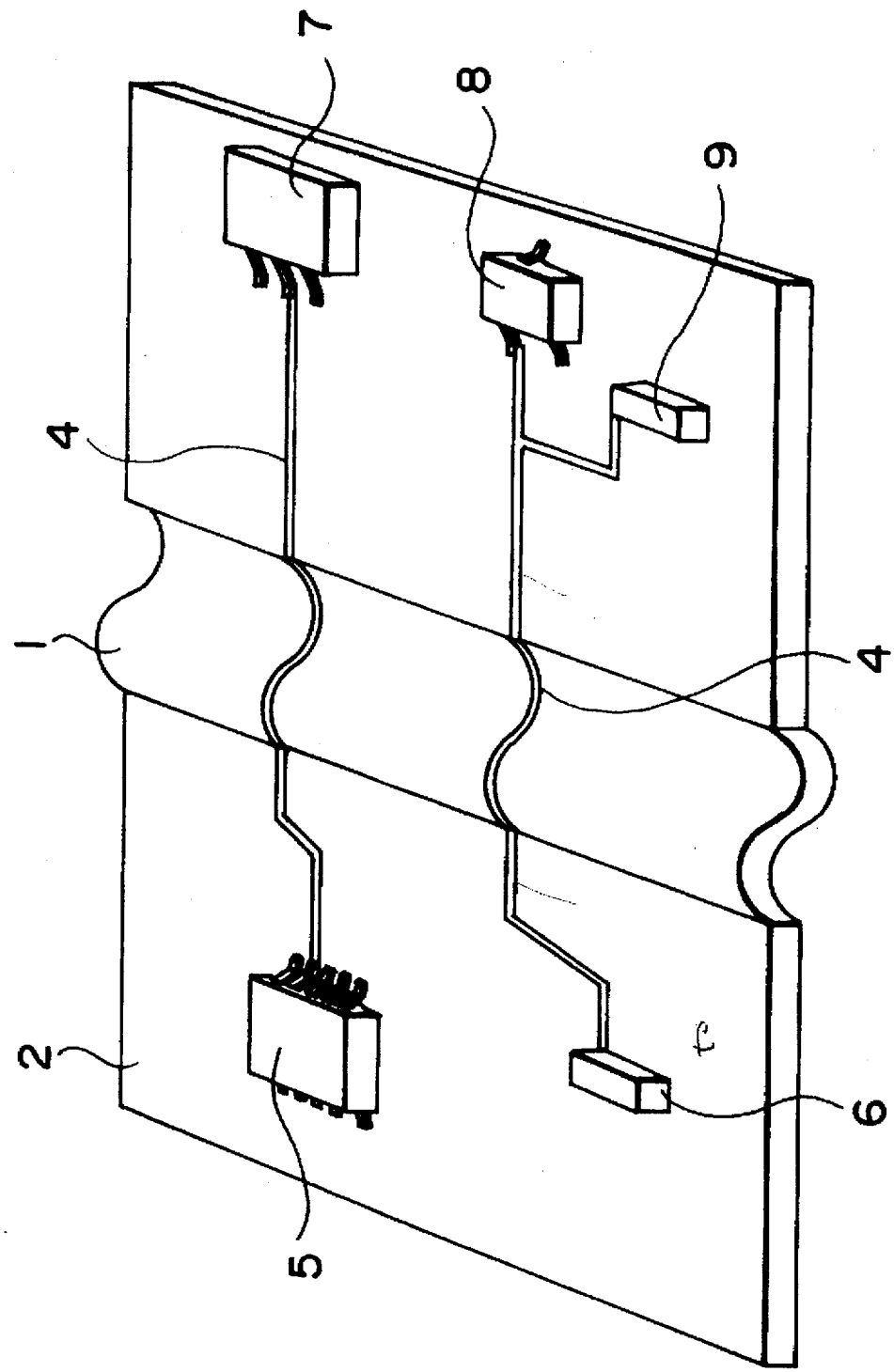
FIG. 1 is a perspective view showing a conventional printed-wiring board.
Figure 2:
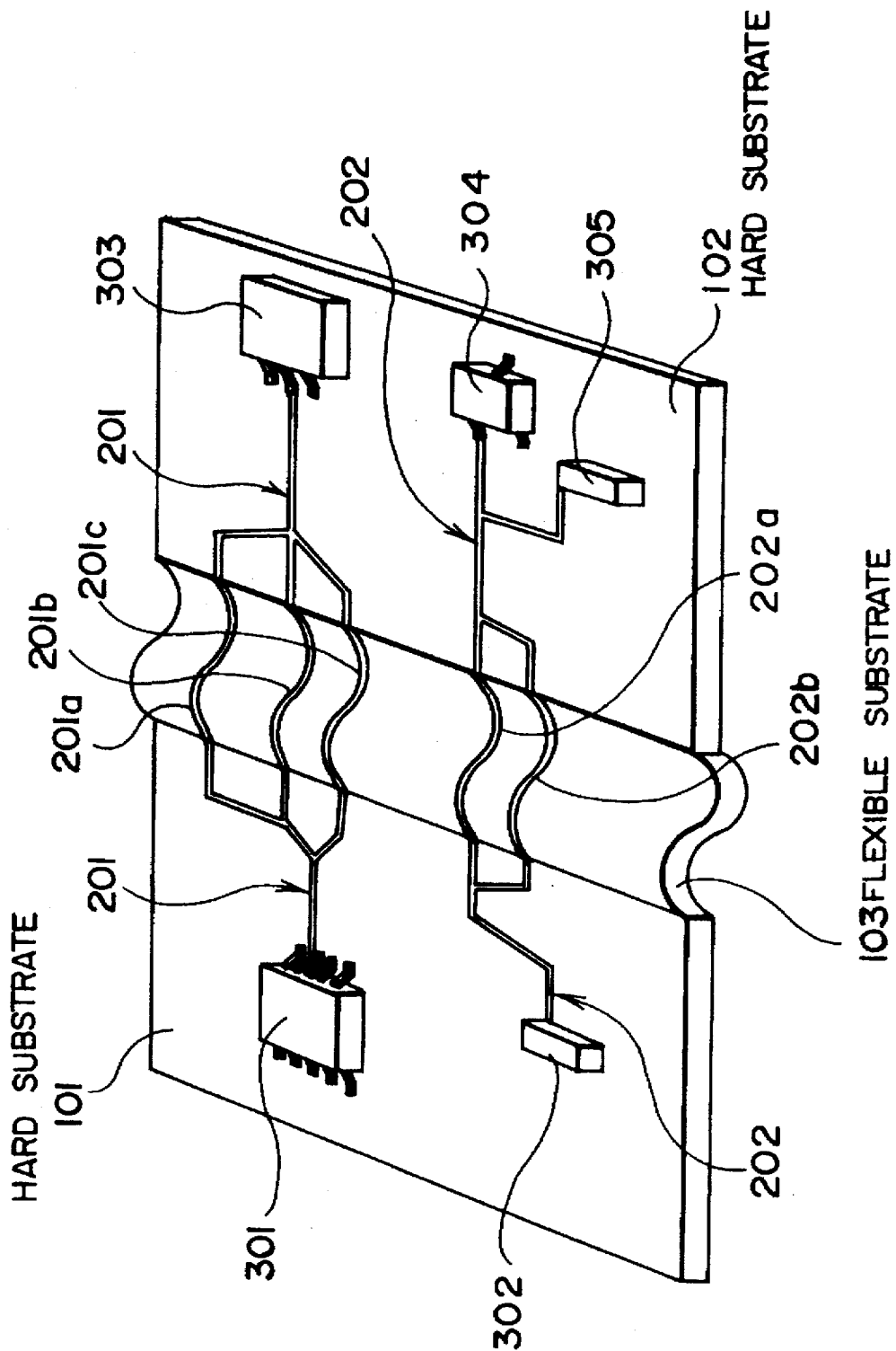
FIG. 2 is a perspective view showing a printed-wiring board constructed in accordance with a first embodiment of the present invention.

Referring to FIG. 2, there is shown a first embodiment of a printed-wiring board in accordance with the present invention. The printed-wiring board comprises two hard substrates 101 and 102 wherein electronic components 301 and 302 are mounted on the hard substrate 101 and electronic components 303–305 on the hard substrate 102. The hard substrates 101 and 102 are mechanically connected through a flexible substrate 103 therebetween by means of glue. Circuit patterns 201 and 202 are printed on the surfaces of the hard substrates 101 and 102 and the flexible substrate 103, the circuit pattern 201 electrically connecting the electronic components 301 and 303, and the circuit pattern 202 also connecting the electronic components 302 and 303 or 305.

On the surface of the flexible substrate 103, a circuit pattern consisting of signal lines 201a–201c and another circuit pattern consisting of signal lines 202a and 202b are printed. The circuit pattern 201 on the surfaces of the two hard substrates 101 and 102 is electrically connected to the signal lines 201a–201c formed on the flexible substrate 103. The circuit patterns 202 on the surfaces of the two hard substrates 101 and 102 is also electrically connected to the signal lines 202a and 202b formed on the flexible substrate 103.

The flexible substrate 103 is formed from a flexible material such as a polyimide material and can be freely curved and bent. With this structure, the printed-wiring board can be mounted on equipment or devices by folding or superimposing the hard substrates 101 and 102 through the flexible substrate 103.

The respective circuit patterns 201 and 202 printed on the surfaces of the hard substrates 101 and 102 are connected to electronic components 301 and 302 mounted on the hard substrate 101 and to electronic components 303–305 mounted on the hard substrate 102 so that the electronic components are electrically connected in predetermined wiring.

A single signal line of the circuit pattern 201 connected to the electronic component 301 is branched into a plurality of signal lines on the hard substrate 101. The respective branched signal lines extend through the flexible substrate 103, and are converged on the other hard substrate 102 to a single signal line. In this embodiment, as shown in FIG. 2, the signal line of the circuit pattern 201 connecting the electronic components 301 and 303 is branched into three signal lines which are connected to the signal lines 201a, 201b, and 201c on the flexible substrate 103, respectively, while the circuit pattern 202 connecting the electronic component 302 and the electronic components 304 and 305 is branched into two signal lines which are connected to the signal lines 202a and 202b on the flexible substrate 103. Thus, each circuit pattern is branched on the hard substrate 101 and is converged on the hard substrate 103, resulting in a plurality of signal paths for a single signal line.

As described above, the respective circuit patterns 201 and 202 are branched on the hard substrate 101 and are converged on the hard substrate 103 and vice versa such that the branched circuit patterns are connected to the corresponding circuit patterns formed on the flexible substrate 103, respectively. Therefore, even if the breaking of a branched line occurred in the circuit patterns 201 and 202 on the flexible substrate 103 due to a bending motion, secular change, thermal stress at the time of thermal shock, or stress during a fabrication process, the operation and performance of equipment or devices would be maintained and no failure would occur, as long as all of the branched lines of the same signal line are not broken. Therefore, in accordance with the present invention, equipment or device failure caused by the breaking of the circuit pattern 201 would scarcely occur even if the flexible substrate 103 were freely curved or bent.

With this structure, for example, by folding the flexible substrate 103 by 180 degrees so that the hard substrates 101 and 102 are superimposed and opposed, a device with a multi-layer structure can be formed from a sheet of printed-wiring board and also a reduction in the size of equipment or devices on which the printed-wiring board is mounted can be realized.

Thus, according to the printed-wiring board of the present invention, a single signal line is branched into a plurality of signal lines on one hard substrate 101, which are connected to the same number of signal lines formed on the flexible substrate 103, respectively, and then the branched signal lines extending from the flexible substrate 103 are converged on the side of the other hard substrate 102. Therefore, even if a line breaking occurs in the circuit pattern 201 or 202, the operation and performance of equipment or devices on which the printed-wiring board is mounted would be maintained as long as all of the branched circuit patterns are not broken.

In addition, the printed-wiring board of this embodiment does not require an additional means such as a reinforcing member which is provided for thermal shock, so the cost of a finished product can be decreased and also the size and weight of equipment or devices can be reduced.

Incidentally, while in the aforementioned embodiment the circuit patterns 201 and 202 have been provided only on the front surface of the flexible substrate 103, the circuit patterns 201 and 202 may be provided on the back surface or both surfaces of the flexible substrate 103 as described hereinafter.

A second embodiment of the printed-wiring board according to the present invention will next be described in reference to FIGS. 3, 4, and 5. The same reference numerals will be applied to the same elements as in the first embodiment shown in FIG. 2.

Figure 3:
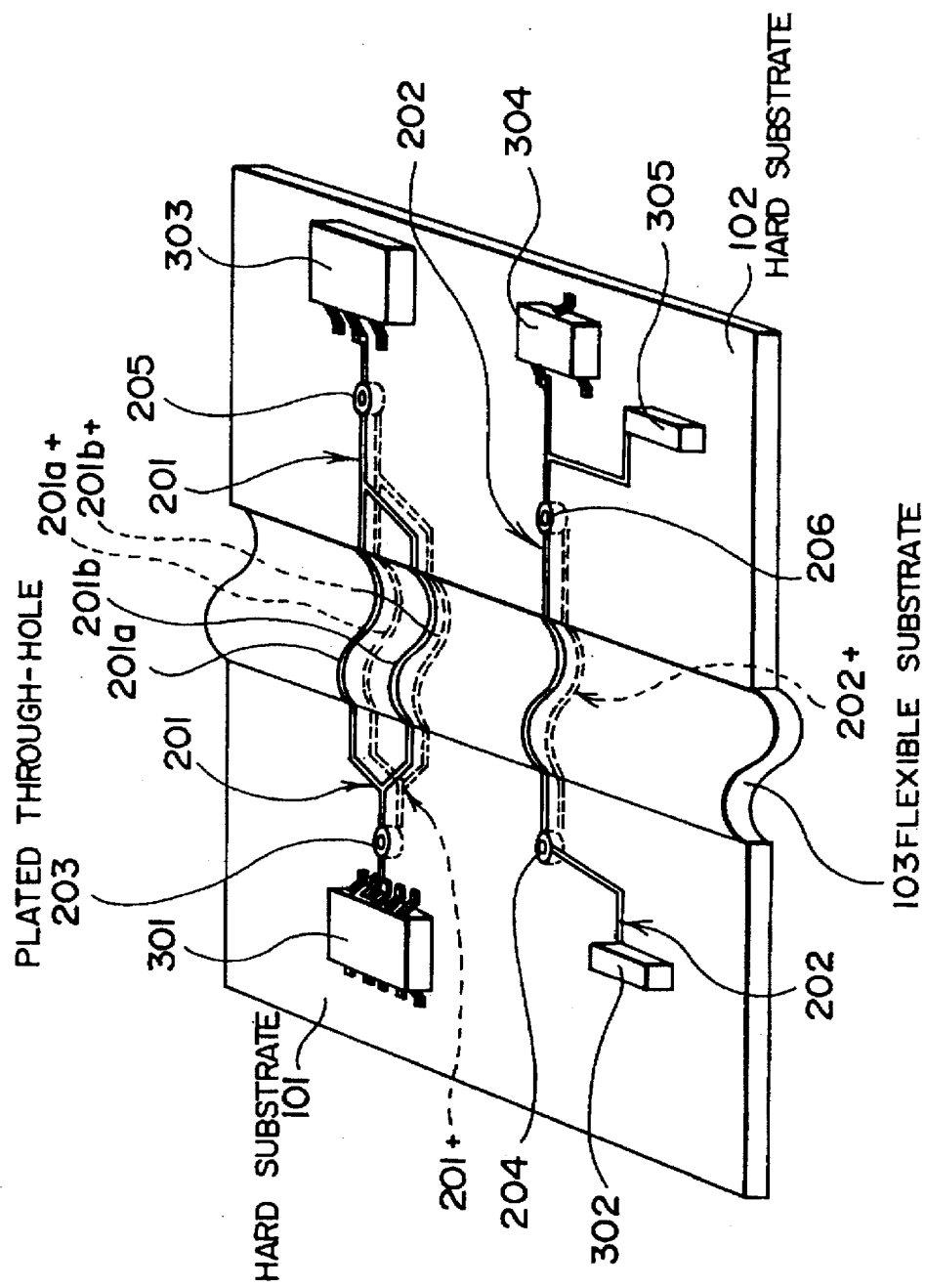
FIG. 3 is a perspective view showing a printed-wiring board constructed in accordance with a second embodiment of the present invention.
Figure 4:
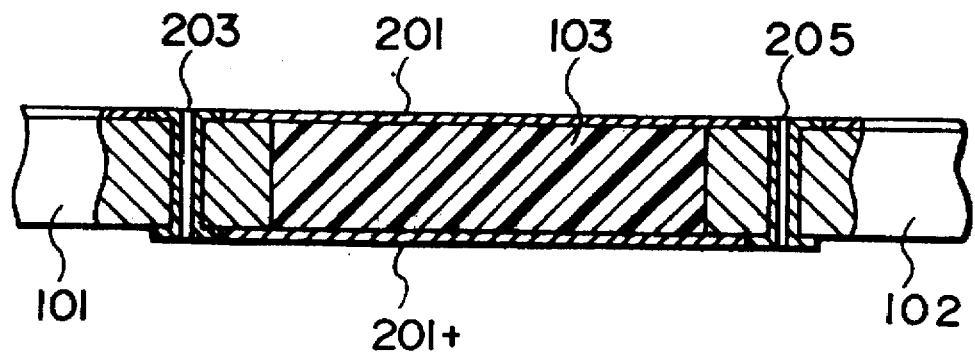
FIG. 4 is a part-sectional view showing the printed-wiring board of FIG. 3.

As illustrated in FIGS. 3 and 4, the hard substrate 101 is provided with plated through-holes 203 and 204 and the hard substrate 102 is also provided with plated through-holes 205 and 206. A single signal line is branched at each of the plated through-holes 203 and 205 into two circuit patterns 201 and 201+ both connecting the electronic components 301 and 303. A signal line of the circuit pattern 201 is branched on the surface of the hard substrate 101 into two signal lines which are connected to the signal lines 201a and 201b formed on the surface of the flexible substrate 103, respectively. The respective signal lines 201a and 201b on the surface of the flexible substrate 103 are connected to two signal lines which join into a single signal line on the surface of the hard substrate 102 and are connected to the plated through-hole 205. Similarly, a signal line of the circuit pattern 201+ is branched on the back surface of the hard substrate 101 into two signal lines which are connected to the signal lines 201a+ and 201b+ on the back surface of the flexible substrate 103, respectively. The respective signal lines 201a+ and 201b+ are connected to two signal lines which join into a single signal line on the back surface of the hard substrate 102 and are connected to the plated through-hole 205.

Figure 5:
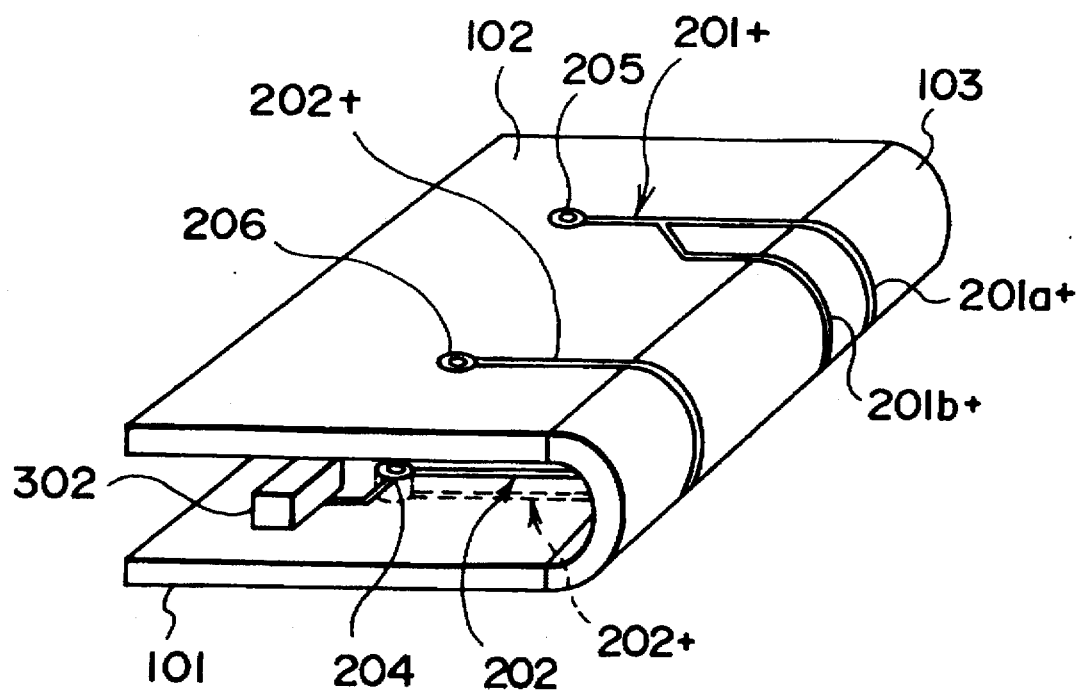
FIG. 5 is a perspective view showing the folded state of the printed-wiring board shown in FIG. 3.

As shown in FIG. 5, the branched portions (201a and 201b) of the upper circuit pattern 201 may be disposed only on the front surface of the flexible substrate 103, while the branched portions (201a+ and 201b+) of the lower circuit pattern 201+ may be disposed only on the back surface of the flexible substrate 103.

Another circuit pattern may be employed. For example, a single signal line is branched at each of the plated through-holes 204 and 206 into two circuit patterns 202 and 202+ which are respectively provided on both sides of the flexible substrate 103 and both connect the electronic components 302 and 304 or 305. A single signal line may be branched at each via-hole or through-hole into three or more circuit patterns which are formed on the respective layers in a multilayer wiring board as described later. Each circuit pattern may include one or more parallel-connected lines as shown in FIGS. 2 and 3.

With the above-mentioned structure according to the second embodiment, the both surfaces of the flexible substrate 103 can be effectively utilized, resulting in the increased number of parallel-connected lines for a single interconnection in a reduced surface area required for the interconnection.

Figure 6:
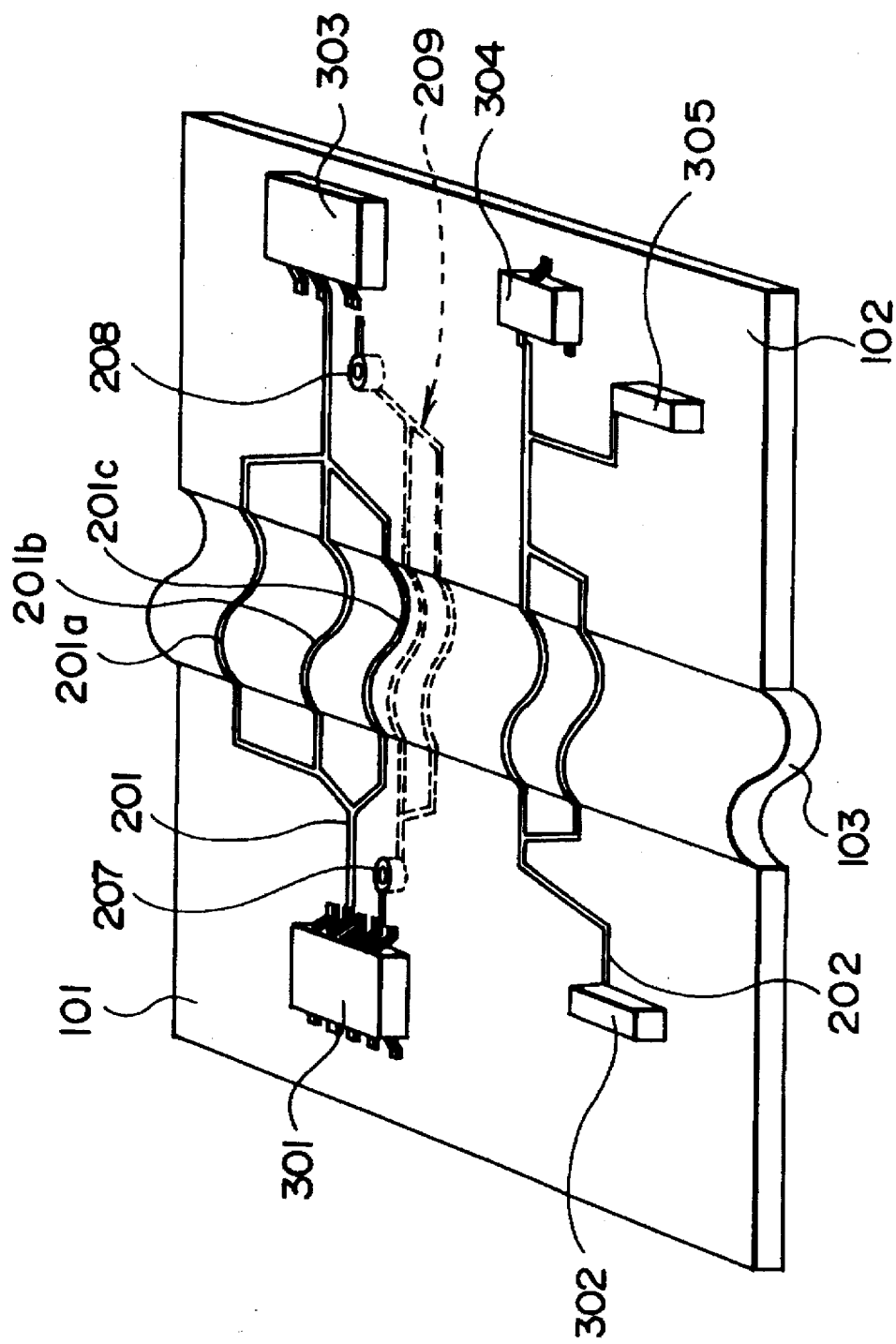
FIG. 6 is a perspective view showing a printed-wiring board constructed in accordance with a third embodiment of the present invention.

Referring to FIG. 6, there is shown a printed-wiring board according to a third embodiment of the present invention. In this embodiment, a plurality of different interconnections (circuit patterns 201 and 209) are formed between the electronic component 301 on the hard substrate 101 and the electronic component 303 on the hard substrate 102. The circuit pattern 201 comprises three signal lines 201a–202c on the front surface of the flexible substrate 103 which are converged to a single signal line on the front surface of each of the hard substrates 101 and 102 (as shown in FIG. 2). On the other hand, the circuit pattern 209 is formed on the back surfaces of hard substrates 101 and 102 and the flexible substrate 103 by means of through-holes-207 and 208. A signal line connected to the plated through-hole 207 is branched on the back surface of the hard substrate 101 into two signal lines which are connected to two signal lines formed on the back surface of the flexible substrate 103, respectively. The respective signal lines on the back surface of the flexible substrate 103 are connected to two signal lines which join into a single signal line on the back surface of the hard substrate 102. The converged signal line is connected to the electronic component 303 through the plated through-hole 208.

In general, electronic components of various kinds for communication equipment are densely mounted on the hard substrate, so the circuit patterns are also densely disposed on the flexible substrate 103. Then, as shown in FIG. 6, one circuit pattern 201 is branched and disposed only on the front surface of the flexible substrate 103, while another circuit pattern 209 is branched and disposed only on the back surface of the flexible substrate 103 through the plated through-holes 207 and 208. Thus, a plurality of circuit patterns can be provided on both sides of the flexible substrate 103, and consequently, the area on both sides of the flexible substrate 103 can be effectively utilized.

While the invention has been described with reference to preferred embodiments thereof, the invention is not to be limited to the details mentioned above. The invention may be applied to a multilayer printed-wiring board, which causes the restricted area on the substrates to be utilized more effectively.

Figure 7:
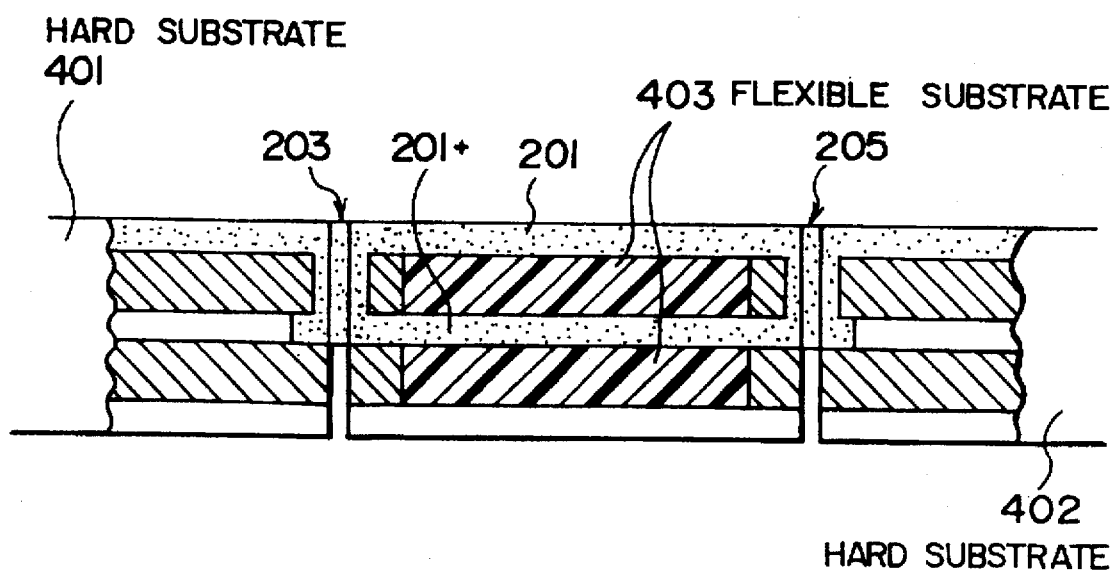
FIG. 7 is a part-sectional view showing a multilayer printed-wiring board constructed in accordance with a fourth embodiment of the present invention.

As shown in FIG. 7 where elements similar to those previously described with reference to FIG. 4 are denoted by the same reference numerals, a multilayer printed-wiring board is composed of hard multilayer substrates 401 and 402 which are connected through a flexible multilayer substrate 403. In this embodiment, by means of via-holes (or through-holes ) 203 and 205, the second circuit pattern 201+ is formed on an inner layer of the hard multilayer substrates 401 and 402 and the flexible multilayer substrate 403. Needless to say, a plurality of circuit patterns as mentioned above may be formed on different layers including the front and back surfaces.

Figure 8:
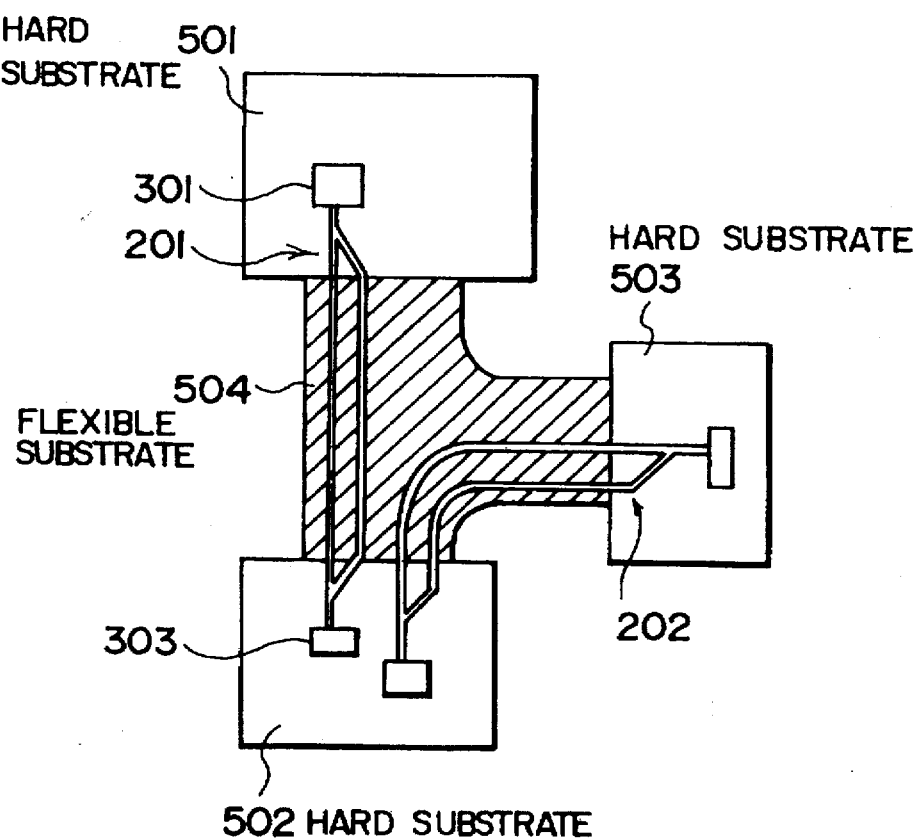
FIG. 8 is a schematic plan view showing a printed-wiring board constructed in accordance with a fifth embodiment of the present invention.

Furthermore, as illustrated in FIG. 8, it is readily considered from the above embodiments that three or more hard substrates 501–503 are connected through a flexible substrate 504 in the same manner as each of the above embodiments.

What is claimed is:

1. A printed-wiring board comprising:
    a first hard substrate having a first conductor formed thereon;
    a second hard substrate having a second conductor formed thereon;
    a flexible substrate for connecting said first and second hard substrates together; and
    a circuit pattern formed in each of said first and second hard substrates and said flexible substrate, for electrically connecting between said first and second conductors formed on said first and second hard substrates through said flexible substrate,
    said circuit pattern comprising a plurality of parallel-connected conductive lines each being spatially separated from each other in said flexible substrate, and both ends of each of the parallel-connected conductive lines being located on the first and second hard substrates, respectively.

2. The printed-wiring board according to claim 1, wherein said parallel-connected conductive lines are formed on a single layer in said flexible substrate and said first and second hard substrates.

3. The printed-wiring board according to claim 2, wherein said parallel-connected conductive lines are formed on a surface of said flexible substrate and said first and second hard substrates.

4. The printed-wiring board according to claim 2, wherein said parallel-connected conductive lines are formed on a back surface of said flexible substrate and said first and second hard substrates.

5. The printed-wiring board according to claim 4, wherein said both ends of each of said parallel-connected conductive lines are connected to the first and second conductors through a pair of connecting conductors which are formed in said first and second hard substrates, respectively.

6. The printed-wiring board according to claim 1, wherein said parallel-connected conductive lines are formed on different layers in said flexible substrate and said first and second hard substrates, respectively.

7. The printed-wiring board according to claim 1, wherein a first group of said parallel-connected conductive line are formed on a first layer in said flexible substrate and said first and second hard substrates and a second group of said parallel-connected conductive lines are formed on a second layer different from said first layer in said flexible substrate and said first and second hard substrates.

8. The printed-wiring board according to claim 7, wherein the first group of said parallel-connected conductive lines are formed on a major surface of said flexible substrate and said first and second hard substrates and the second group of said parallel-connected conductive lines are formed on a back surface of the first layer in said flexible substrate and said first and second hard substrates.

9. The printed-wiring board according to claim 7, wherein said both ends of each of said parallel-connected conductive lines which are formed on an inner layer are connected to the first and second conductors through a pair of connecting conductors which are formed in said first and second hard substrates, respectively.

10. The printed-wiring board according to claim 8, wherein said both ends of each of said parallel-connected conductive lines which are formed on the back surface are connected to the first and second conductors through a pair of conductive connecting holes which are formed in said first and second hard substrates, respectively.

11. The printed-wiring board according to claim 1, wherein said circuit pattern further comprises:
  a first conductive line connected to said first conductor and formed on said first hard substrate;
  a second conductive line connected to said second conductor and formed on said second hard substrate;
  a first branching portion at which said first conductive line branches into said parallel-connected conductive lines, said branching point being formed in said first hard substrate; and
  a second branching portion at which said parallel-connected conductive lines are converged to said second conductive line.

12. The printed-wiring board according to claim 11, wherein said first and second branching portions are both formed on a single layer of said flexible substrate and said first and second hard substrates.

13. The printed-wiring board according to claim 11, wherein said first and second branching portions are both formed with a conductive hole, wherein a first group of said parallel-connected conductive lines are formed on a first layer in said flexible substrate and said first and second hard substrates and a second group of said parallel-connected conductive lines are formed on a second layer different from said first layer in said flexible substrate and said first and second hard substrates.

14. The printed-wiring board according to claim 11, wherein each of said first and second branching portions comprises:
  at least one branching point formed on a first layer of said flexible substrate and said first and second hard substrates; and
  a conductive hole through which a first group of said parallel-connected conductive lines are formed on said first layer in said flexible substrate and said first and second hard substrates and a second group of said parallel-connected conductive lines are formed on a second layer different from said first layer in said flexible substrate and said first and second hard substrates.

15. A printed-wiring board comprising:
  a first hard substrate having a plurality of first conductors formed thereon;
  a second hard substrate having a plurality of second conductors formed thereon, said second conductors being electrically connected to said first conductors, respectively;
  a flexible substrate for connecting said first and second hard substrates together; and
  a plurality of circuit patterns formed in each of said first and second hard substrates and said flexible substrate, for electrically connecting said first conductors with said second conductors through said flexible substrate, respectively,
  each of said circuit patterns comprising a plurality of parallel-connected conductive lines each being spatially separated from each other in said flexible substrate, and both ends of each of the parallel-connected conductive lines being located on the first and second hard substrates, respectively.

16. The printed-wiring board according to claim 15, wherein said parallel-connected conductive lines are formed on a single layer in said flexible substrate and said first and second hard substrates.

17. The printed-wiring board according to claim 16, wherein said parallel-connected conductive lines are formed on a surface of said flexible substrate and said first and second hard substrates.

18. The printed-wiring board according to claim 16, wherein said parallel-connected conductive lines are formed on a back surface of said flexible substrate and said first and second hard substrates.

19. The printed-wiring board according to claim 18, wherein said both ends of each of said parallel-connected conductive lines are connected to said first and second conductors through a pair of connecting conductors which are formed in said first and second hard substrates, respectively.

20. The printed-wiring board according to claim 15, wherein said parallel-connected conductive lines are formed on different layers in said flexible substrate and said first and second hard substrates, respectively.

21. The printed-wiring board according to claim 15, wherein a first group of said parallel-connected conductive lines are formed on a first layer in said flexible substrate and said first and second hard substrates and a second group of said parallel-connected conductive lines are formed on a second layer different from said first layer in said flexible substrate and said first and second hard substrates.

22. The printed-wiring board according to claim 21, wherein the first group of said parallel-connected conductive lines are formed on a major surface of said flexible substrate and said first and second hard substrates and said second group of said parallel-connected conductive lines are formed on a back surface of said first layer in said flexible substrate and said first and second hard substrates.

23. The printed-wiring board according to claim 21, wherein said both ends of each of said parallel-connected conductive lines which are formed on an inner layer are connected to said first and second conductors through a pair of connecting conductors which are formed in said first and second hard substrates, respectively.

24. The printed-wiring board according to claim 22, wherein said both ends of each of said parallel-connected conductive lines which are formed on the back surface are connected to said first and second conductors through a pair of conductive connecting holes which are formed in said first and second hard substrates, respectively.

25. The printed-wiring board according to claim 15, wherein said circuit pattern further comprises:
   a first conductive line connected to said first conductor and formed on said first hard substrate;
   a second conductive line connected to said second conductor and formed on said second hard substrate;
   a first branching portion at which said first conductive line branches into said parallel-connected conductive lines, said branching point being formed in said first hard substrates; and
   a second branching portion at which said parallel-connected conductive lines are converged to said second conductive line.

26. The printed-wiring board according to claim 25, wherein said first and second branching portions are both formed on a single layer of said flexible substrate and said first and second hard substrates.

27. The printed-wiring board according to claim 25, wherein said first and second branching portions are both formed with a conductive hole, wherein a first group of said parallel-connected conductive lines are formed on a first layer in said flexible substrate and said first and second hard substrates and a second group of said parallel-connected conductive lines are formed on a second layer different from said first layer in said flexible substrate and said first and second hard substrates.

28. The printed-wiring board according to claim 25, wherein each of said first and second branching portions comprises:
   at least one branching point formed on a first layer of said flexible substrate and said first and second hard substrates; and
   a conductive hole through which a first group of said parallel-connected conductive lines are formed on said first layer in said flexible substrate and said first and second hard substrates and a second group of said parallel-connected conductive lines are formed on a second layer different from said first layer in said flexible substrate and said first and second hard substrates.

29. A printed-wiring board comprising:
   a first hard substrate having a first conductor formed thereon, said first conductor branching into a predetermined number of first signal lines at at least one first branching point;
   a second hard substrate having a second conductor formed thereon, said second conductor branching into said predetermined number of second signal lines at at least one second branching point, said second signal lines corresponding one by one to said first signal lines;
   a flexible substrate for connecting said first and second hard substrates together, said flexible substrate having a circuit pattern formed thereon, said circuit pattern comprising said predetermined number of conductive lines each being spatially separated from each other on said flexible substrate, said conductive lines electrically connecting said first signal lines with said second signal lines, respectively.

30. A printed-wiring board comprising:
   a first hard substrate having a plurality of first conductors formed thereon, each of said first conductors branching into a predetermined number of first signal lines at at least one first branching point;
   a second hard substrate having a plurality of second conductors formed thereon, each of said second conductors branching into said predetermined number of second signal lines at at least one second branching point, said second conductors corresponding one by one to said first conductors, and said second signal lines corresponding one by one to said first signal lines;
   a flexible substrate for connecting said first and second hard substrates together, said flexible substrate having a plurality of circuit patterns formed thereon, each of said circuit patterns comprising said predetermined number of conductive lines each being spatially separated from each other on said flexible substrate, said conductive lines electrically connecting said first signal lines with said second signal lines, respectively.

31. A printed-wiring board comprising:
   a plurality of hard substrates each having a conductor formed thereon;
   a flexible substrate for connecting said hard substrates together; and
   a circuit pattern formed in each of said hard substrates and said flexible substrate, for electrically connecting a conductor formed on a first hard substrate to a conductor formed on a second hard substrate through said flexible substrate,
   said circuit pattern comprising a plurality of parallel-connected conductive lines each being spatially separated from each other in said flexible substrate, and both ends of each of said parallel-connected conductive lines being located on said first and second hard substrates, respectively.

32. A printed-wiring board comprising:
   a plurality of hard substrates each having a plurality of conductors formed thereon;
   a flexible substrate for connecting said hard substrates together; and
   a plurality of circuit patterns formed in each of said hard substrates and said flexible substrate, each of said circuit patterns electrically connecting a conductor formed on a first hard substrate to a conductor formed on a second hard substrate through said flexible substrate, respectively,
   each of said circuit patterns comprising a plurality of parallel-connected conductive lines each being spatially separated from each other in said flexible substrate, and both ends of each of said parallel-connected conductive lines being located on said first and second hard substrates, respectively.

* * * * *